United States Patent
Rathor et al.

(10) Patent No.: US 6,818,558 B1
(45) Date of Patent: Nov. 16, 2004

(54) METHOD OF MANUFACTURING A DIELECTRIC LAYER FOR A SILICON-OXIDE-NITRIDE-OXIDE-SILICON (SONOS) TYPE DEVICES

(75) Inventors: Manuj Rathor, Santa Clara, CA (US); Krishnaswamy Ramkumar, San Jose, CA (US); Fred Jenne, Los Gatos, CA (US); Loren Lancaster, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 49 days.

(21) Appl. No.: 10/185,470

(22) Filed: Jun. 28, 2002

Related U.S. Application Data

(63) Continuation-in-part of application No. 09/920,378, filed on Jul. 31, 2001, now Pat. No. 6,709,928.

(51) Int. Cl.[7] .................... H01L 21/311; H01L 21/469
(52) U.S. Cl. ................... 438/694; 438/697; 438/784; 438/787
(58) Field of Search .................. 438/264, 424, 438/586, 587–597, 791, 792, 694, 697, 784, 787, 788, 911

(56) References Cited

U.S. PATENT DOCUMENTS

| | | | | |
|---|---|---|---|---|
| 4,395,438 A | * | 7/1983 | Chiang | 438/791 |
| 4,870,470 A | * | 9/1989 | Bass et al. | 257/324 |
| 5,408,115 A | * | 4/1995 | Chang | 257/324 |
| 5,937,323 A | * | 8/1999 | Orczyk et al. | 438/624 |
| 5,939,333 A | * | 8/1999 | Hurley et al. | 438/791 |
| 5,972,804 A | * | 10/1999 | Tobin et al. | 438/786 |
| 6,150,286 A | * | 11/2000 | Sun et al. | 438/791 |
| 6,162,700 A | * | 12/2000 | Hwang et al. | 438/424 |
| 6,217,658 B1 | * | 4/2001 | Orczyk et al. | 118/697 |
| 6,268,299 B1 | * | 7/2001 | Jammy et al. | 438/791 |
| 6,335,288 B1 | * | 1/2002 | Kwan et al. | 438/694 |
| 6,399,484 B1 | * | 6/2002 | Yamasaki et al. | 438/648 |
| 6,468,927 B1 | * | 10/2002 | Zhang et al. | 438/779 |
| 6,559,026 B1 | * | 5/2003 | Rossman et al. | 438/424 |
| 6,586,343 B1 | * | 7/2003 | Ho et al. | 438/758 |
| 6,602,771 B2 | * | 8/2003 | Inoue et al. | 438/585 |
| 6,709,928 B1 | * | 3/2004 | Jenne et al. | 438/264 |
| 6,713,127 B2 | * | 3/2004 | Subramony et al. | 427/255.37 |

\* cited by examiner

*Primary Examiner*—Michael Lebentritt
(74) *Attorney, Agent, or Firm*—Bradley T. Sako

(57) ABSTRACT

A method of forming a charge storing layer is disclosed. According to an embodiment, a method may include the steps of forming a first portion of a charge storing layer with a first gas flow rate ratio (step 102), forming at least a second portion of the charge storing layer by changing to a second gas flow rate ratio that is different than the first gas flow rate ratio (step 104), and forming at least a third portion of the charge storing layer by changing to a third gas flow rate ratio that is different than the second gas flow rate ratio (step 106).

20 Claims, 8 Drawing Sheets

METHOD OF MANUFACTURING A DIELECTRIC LAYER FOR A SILICON-OXIDE-NITRIDE-OXIDE-SILICON (SONOS) TYPE DEVICES

This application is a continuation-in-part of U.S. application Ser. No. 09/920,378 filed Jul. 31, 2001, now U.S. Pat. No. 6,709,928, by Jenne et al., entitled "Semiconductor Device Having Silicon-Rich Layer and Method of Manufacturing Such a Device," incorporated by reference herein.

TECHNICAL FIELD

The present invention relates generally to dielectrics for field effect semiconductor devices, and more particularly to dielectrics that may retain charge for nonvolatile insulated gate field effect transistors.

BACKGROUND OF THE INVENTION

As is well known, semiconductor devices can include insulated gate field effect transistor (IGFET) type devices. IGFET-type devices typically include a transistor gate separated from a channel region by a dielectric. A potential applied to a gate can then be varied to alter channel conductivity.

While many IGFET type devices are volatile (e.g., conventional metal-oxide-semiconductor FETs), nonvolatile devices may also include IGFET-like approaches. Nonvolatile IGFET-like devices typically retain electric charge through one or more methods (e.g., storing, trapping charge). One conventional nonvolatile device can be a floating gate electrically erasable programmable read only memory (EEPROM). A floating gate EEPROM can include a floating gate electrode situated between a control gate and a channel. Charge, including electrons and/or "holes", may be stored in a floating gate electrode. Such a charge may alter a threshold voltage of a resulting nonvolatile IGFET-type device. As will be noted below, a drawback to any floating gate device can be higher programming and/or erase voltages with respect to other nonvolatile approaches.

Another nonvolatile IGFET type device can include a dielectric interface to trap charge. For example, devices have been proposed that include a metal gate formed over a dielectric of silicon nitride and silicon dioxide. Such devices have been referred to as metal-nitride-oxide-semiconductor (MNOS) devices. A drawback to many MNOS devices has been lack of charge retention and/or uniformity of programming.

A third type of nonvolatile device may include one or more dielectric layers for storing charge. Such devices may be referred to generally as silicon-oxide-nitride-oxide-silicon (SONOS) type devices. One very basic type of SONOS device may include a polycrystalline silicon ("polysilicon") gate formed over a dielectric layer that includes a silicon nitride layer sandwiched between silicon dioxide layers.

SONOS devices can have lower programming voltages than other conventional nonvolatile devices, such as some types of floating gate devices. In addition, the SONOS fabrication process can be compatible with standard complementary metal oxide semiconductor (CMOS) process technology. To maintain this compatibility, SONOS devices may be scaled along with other transistors used in the process. The ability of SONOS devices to maintain performance and reliability as they are scaled can be an important feature.

To better understand the formation of SONOS devices, a conventional way of forming a SONOS device is set forth in FIGS. 9A, 9B, and 10A to 10F. FIG. 9A is a flowchart illustrating certain process steps involved in crating an integrated circuit containing SONOS devices. FIG. 9B is a side cross sectional view of a SONOS type device during a program operation. FIGS. 10A–10F set forth a number of side cross-sectional views of a portion of an integrated circuit containing SONOS devices following the various conventional process steps described in FIG. 9A.

The conventional process described in FIG. 9A is designated by the general reference character 900. A conventional process 900 may include the steps of growing a tunnel oxide (step 902) in a furnace. Subsequently, wafers that now include the tunnel oxide can be transferred from a furnace to a different machine for growing other layers in an ONO dielectric for a SONOS-type device. In FIG. 9A, such a step may include transferring wafers to a chemical vapor deposition (CVD) machine (step 904).

A conventional method 900 may further include depositing a silicon nitride layer over tunnel oxide in a CVD machine (step 906), depositing a top oxide layer over a nitride layer in the same or a different CVD machine (step 908), and depositing a polysilicon gate layer (step 910).

The above steps may form various layers for a SONOS-type device. Such layers can then be patterned to form a SONOS-type transistor. Patterning steps may include forming a gate mask (step 912), etching gate structures (step 914), and depositing and etching a spacer layer (step 916).

Referring to FIG. 10A, a side cross-sectional view of a portion of an integrated circuit prior to the beginning of a conventional process 900 is shown. An integrated circuit portion includes a substrate 1000, and may include isolation regions 1002 formed by prior process steps. As an example, isolation regions 1002 may be formed by various conventional isolation processes including but not limited to shallow trench isolation (STI) or the local oxidation of silicon (LOCOS).

It is noted that a substrate 1000 may also include various impurity regions, formed by ion implantation and/or other diffusion methods. As but a few examples, n-type wells may be formed in a p-type substrate (or vice versa), or p-type wells may be formed within n-type wells (or vice versa).

Referring again to FIG. 9A, a conventional process 900 may begin by growing a tunnel oxide (step 902) in a furnace. A portion of an integrated circuit following step 902 is set forth in FIG. 10A. Referring to FIG. 10A, a portion of an integrated circuit includes a tunnel oxide 1004 on a substrate 1000.

A conventional process 900 can continue by transferring a wafer from a furnace to a chemical vapor deposition (CVD) machine (step 904). A conventional process 900 can continue by depositing a silicon nitride layer in a CVD machine (step 906). A portion of an integrated circuit following step 906 is set forth in FIG. 10B. Referring to FIG. 10B, an integrated circuit may now be situated within a CVD machine, an integrated circuit portion can now include a nitride layer 1006 deposited over a tunnel oxide 1004. A nitride layer 1006 can conventionally include essentially only silicon nitride ($Si_3N_4$).

A conventional process 900 can continue by depositing a top oxide layer (step 908) in a chemical vapor deposition (CVD) machine. Referring to FIG. 10C, an example of a portion of an integrated circuit following step 908 is set forth. At this point, a tunnel oxide 1004, a nitride layer 1006 and a top oxide layer 1008 have been formed over a substrate 1000. A top oxide layer 1008 can be conventionally formed by chemical vapor deposition (CVD).

A conventional process 900 can continue by depositing a polysilicon gate layer (step 910). An example of a portion of an integrated circuit following a step 910 is set forth in FIG. 10D. Referring to FIG. 10D, a polysilicon gate layer 1010 has been deposited on a top oxide layer 1008. As also shown in FIG. 10D, a gate protection insulator 1012 may also be formed over polysilicon gate layer 1010.

At this point, in a conventional process 900, silicon-oxide-nitride-oxide-silicon (SONOS) layers can correspond to a substrate 1000, tunnel oxide 1004, nitride layer 1006, top oxide layer 1008, and polysilicon gate layer 1010, respectively.

A conventional process 900 may continue with lithography and etch steps to isolate and form SONOS devices. In conventional lithography, a gate mask may first be formed (step 912). An example of a portion of an integrated circuit following step 912 is set forth in FIG. 10E. A gate mask material 1014 can be deposited and patterned using any of various lithographic techniques. A gate mask material 1014 may generally include of a photoresist material.

Following the formation of a gate mask (step 912), gate structures can be etched (step 914). Referring now to FIG. 10F, a portion of an integrated circuit following step 912 is set forth. A suitable etching process can remove portions of the tunnel oxide 1004, nitride layer 1006, top oxide layer 1008, polysilicon gate layer 1010, and a gate protection insulator 1012 that are not covered by gate mask material 1014. In this manner, SONOS device gate structures 1016 can be formed on a substrate 1000.

A conventional process 900 can continue by depositing and etching a spacer layer (step 916). An example of a portion of an integrated circuit following step 916 is set forth in FIG. 10F. Referring to FIG. 10F, a spacer layer 1016 can be formed that surrounds and electrically isolates SONOS gate structures 1018. A spacer layer 1016 may include silicon dioxide. Note that in FIG. 10F, a gate mask layer 1014 has been removed by suitable process means.

While the conventional process described may produce an integrated circuit containing SONOS devices of reasonable quality and performance, certain aspects of a process may be important in maintaining device performance and/or reliability. This can be particularly true as SONOS devices are scaled to realize lower programming voltages and/or in order to maintain compatibility with CMOS process technology. Conventional SONOS-type dielectrics may suffer from certain drawbacks as SONOS-type devices are scaled down, particularly, as a thickness of an ONO dielectric within a SONOS-type device is reduced.

A drawback to conventional SONOS-type devices will now be described with reference to FIG. 9B. FIG. 9B is a side cross sectional view representation of a conventional SONOS-type device. FIG. 9B shows various portions of a SONOS device, such as those set forth in FIGS. 10A to 10F. Accordingly, like portions are referred to by the same reference characters.

FIG. 9B shows a conventional SONOS-type device in a conventional programming operation. Conventionally, an electric field can be created across an ONO dielectric (LAYERS 1004, 1006 and 1008). For example, a gate 1010 may be set to a different potential with respect to a substrate 1000. Provided such a field is large enough, charge (e.g., electrons, one of which is shown as 918) can tunnel from a substrate 1000 into one or more layers of an ONO dielectric.

A tunneling path is represented by arrows in FIG. 9B. If an ONO dielectric is sufficiently thick, charge may accumulate within a charge storing layer 1006. However, as an ONO dielectric is reduced in thickness (e.g., as devices are scaled down), in a conventional device, a majority of charge may tunnel through a middle nitride layer 1006 and accumulate at an interface between a top oxide layer 1008 and a middle nitride layer 1006. A resulting charge distribution is represented by a graph in FIG. 9B. As shown by curve 920 a majority of charge may reside an interface of layers 1006 and 1008. This is in contrast to conventional SONOS devices with a thicker ONO dielectric, in which a majority of charge may be situated closer to a substrate 1000 (within middle nitride layer 1006 and/or an interface between nitride layer 1006 and tunnel oxide layer 1004). Such a charge distribution for thicker ONO dielectric is shown by dashed lines in FIG. 9B.

Due to such a difference in charge distribution, an amount of charge and/or a programming time may not scale at the same rate as a reduction in thickness. In particular, more charge and/or a longer programming time may be needed to establish a proportional change in threshold voltage for a given smaller ONO dielectric thickness. Thinning down a conventional ONO dielectric may also degrade charge retention characteristics.

It would be desirable to provide a method of forming a dielectric layers for a SONOS-type device that may overcome the limitations noted above.

SUMMARY OF THE INVENTION

According to the present invention a method for forming a charge storing layer of a semiconductor device may include forming a first portion of a charge storing layer with a plurality of source gases introduced to a reaction chamber at a first gas flow rate ratio. At least a second portion of the charge storing layer may be formed by changing to a second gas flow rate ratio.

According to one aspect of the embodiments, a first gas flow rate ratio can be no less than 2:1 with respect to a first source gas and a second source gas.

According to another aspect of the embodiments, a second gas flow rate ratio can be less than 1:2 with respect to the first source gas and the second source gas.

According to another aspect of the embodiments, a first gas flow rate ratio can be less than 2.7:1 with respect to a first source gas and a second source gas.

According to another aspect of the embodiments, a method may further include forming at least a third portion of the charge storing layer by changing to a third gas flow rate ratio from the second gas flow rate ratio. In one particular embodiment, a third gas flow rate ratio can be essentially the same as a first gas flow rate ratio.

The present invention may also include a method of forming a charge storing dielectric that includes forming at least one charge trapping portion of a charge storing layer by switching from a first flow rate ratio of source gases to a second flow rate ratio of the source gases.

According to another aspect of the embodiments, a first and second flow rate ratio can be between a silicon source gas (Si) and at least another source gas (X). A first Si:X ratio can be less than a second Si:X ratio.

According to another aspect of the embodiments, a first and second flow rate ratio can be between a silicon source gas (SSG) and at least another source gas (X). A first SSG:X ratio can be less than a second SSG:X ratio.

According to another aspect of the embodiments, the other source gas can be a nitrogen source gas, more particularly, ammonia gas.

According to another aspect of the embodiments, forming the at least one charge trapping portion of the charge storing layer can include forming a silicon-rich charge trapping portion of a silicon oxynitride charge storing layer by switching to the second flow rate ratio.

According to another aspect of the embodiments, a charge trapping portion can have a thickness of no more than 20 angstroms.

The present invention may also include a method of forming a nonvolatile transistor. Such a method may include forming a multilayered dielectric between a tunnel dielectric and a top insulating layer by temporarily changing the rate at which a first constituent element can be introduced into a reaction chamber with respect to a second constituent element.

According to another aspect of the embodiments, a multilayered dielectric may include a silicon nitride and a first constituent element may include silicon and a second constituent element may include nitrogen.

According to another aspect of the embodiments, changing a changing the rate at which a first constituent element can be introduced includes increasing the rate at which the first constituent element can be introduced into the chamber with respect to a second constituent element.

According to another aspect of the embodiments, changing the rate at which a first constituent element can be introduced includes increasing the rate at which the first constituent element can be introduced into the chamber with respect to a second constituent element.

According to another aspect of the embodiments, a method may further include forming a top insulating layer by depositing a layer comprising silicon dioxide.

According to another aspect of the embodiments, a method may further include forming a conductive gate layer over the top insulating layer.

DETAILED DESCRIPTION OF THE EMBODIMENTS

Various embodiments of the present invention will now be discussed in conjunction with a number of figures. The embodiments set forth a method for forming a dielectric for a SONOS-type device and a corresponding SONOS-type device.

A first embodiment may include a method of forming a charge storing layer that includes changing gas flow rate ratios for precursor gases that form such a dielectric. A resulting charge storing layer may be included within a field effect transistor (FET) device, more particularly, within an insulated gate FET, even more particularly within a non-volatile FET as a charge storing dielectric that can selectively alter a threshold voltage for such a FET.

Figure 1:
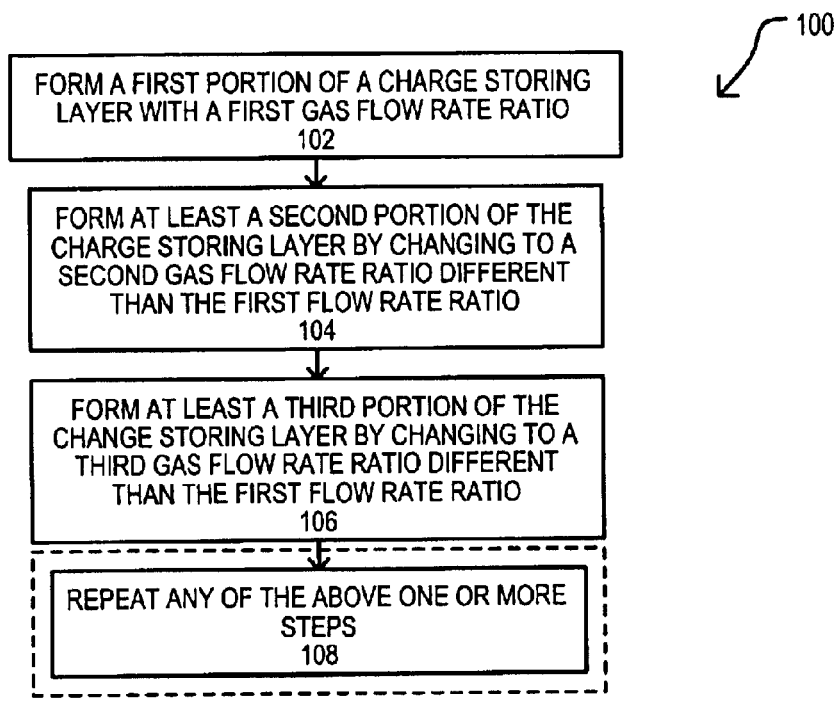
FIG. 1 is a flow diagram of a method of forming a charge storing layer according to a first embodiment.

A method according to a first embodiment is set forth in FIG. 1 and designated by the general reference character 100. A method 100 may include forming a first portion of a charge storing layer with a first gas flow rate ratio (step 102). Such a step may include introducing two or more precursor gases into a reaction chamber, each having a particular flow rate, to form a first portion of a charge storing layer. Elements within such precursor gases may combine to form such a first portion. Preferably, a first portion of a charge storing layer may be formed by chemical vapor deposition (CVD) with such precursor gases at predetermined flow rates. Even more preferably, a CVD method may be a low pressure CVD.

In one particular arrangement, a first portion of a charge storing layer may comprise a nitride, more particularly, stoichiometric and/or non-stoichiometric silicon nitride, even more preferably silicon oxynitride. Base precursor gases may include one or more silicon containing gases, one or more nitrogen containing gases. Further, in the case of a silicon oxynitride, one or more gases may be an oxygen source, as well. In one very particular arrangement, a first portion of a charge storing layer may comprise silicon oxynitride deposited according to LPCVD techniques, with precursor gases that include dichlorosilane (DCS, $SiCl_2H_2$) as a silicon source, ammonia ($NH_3$) as a nitrogen source, and nitrous oxide ($N_2O$) as an oxygen source and/or a nitrogen source.

Flow rate ratios between a nitrogen source and a silicon source may be at least 2:1, more preferably at least 3:1. In one particular approach, an $NH_3$ flow rate may be 24 times greater than a DCS flow rate, more preferably about three times greater. In addition, an $N_2O$ flow rate may be 1–3 times greater than a DCS flow rate, more preferably about two times greater. Even more preferably, an $NH_3$ flow rate may be about 150 standard cubic centimeters per minute (scam), a DCS flow rate may be about 50 sccm, and an $N_2O$ flow rate may be about 110–117 sccm.

In an LPCVD process at the latter flow rates indicated above, a chamber temperature may be in the general range of 700–800° C., preferably about 760° C. A deposition time may be in the general range of 5–7 minutes, preferably about 6.5 minutes. In a preferred embodiment, $NH_3$ may be introduced into an LPCVD reaction chamber 1–2 minutes prior to the other reactant gases (e.g., $N_2O$ and DCS).

Figure 2A:
FIGS. 2A to 2C are side cross-sectional views showing the method of FIG. 1.

A portion of an integrated circuit following a step 102 is shown in FIG. 2A. Prior to a step 102, an integrated circuit may include a substrate 200 that can include one or more isolation structures 202 formed by conventional process steps. Thus, it is understood that a substrate 200 may include impurity regions, such as wells and/or channel regions. A step 102 can result in a first portion of a charge storing layer 204 may be formed over a substrate 200.

Referring again to FIG. 1, a first embodiment 100 may also include by forming at least a second portion of a charge storing layer by changing to a second gas flow rate ratio that is different than a first gas flow rate ratio (step 104).

Preferably, a step 104 may include increasing a silicon source gas flow rate with respect to a nitrogen source gas flow rate. Such a process step may result in a second portion of a charge storing layer having a greater proportion of silicon than a first portion of a charge storing layer. In one very particular arrangement, a second portion of a charge storing layer may comprise silicon oxynitride deposited according to LPCVD techniques, with precursor gases that include DCS as a silicon source and $NH_3$ as a nitrogen source. Such a silicon oxynitride layer may have a higher percentage of silicon than a first portion of a charge storing layer.

In one arrangement, flow rate ratios between a nitrogen source and a silicon source may be at least 1:2, more preferably about 1:3. In one particular approach, a flow rate ratio between $NH_3$ and DCS may be reduced from a higher flow rate ratio (e.g., 3:1) to a lower flow rate ratio of about 1:2–4, more preferably about 1:3. At the same time, a flow rate for other gases may be substantially reduced. As but one example, if $N_2O$ was previously introduced into a reaction chamber, such a gas flow rate may be reduced to zero. Preferably, an $NH_3$ flow rate may be about 30 sccm, a DCS flow rate may be about 90 sccm, and an $N_2O$ flow rate may be 0 sccm.

In an LPCVD process at the latter flow rates indicated above, a chamber temperature may be essentially the same as that for a first portion of a charge storing layer: in the general range of 700–800° C., preferably about 760° C. A deposition time may be in the general range of 1–2 minutes, preferably about 1.5 minutes.

In this way, first flow rate ratios may form a first portion of a charge storing layer. Flow rate ratios may then be switched to form a second portion of a charge storing layer having a greater percentage of silicon than a first portion. A higher percentage of silicon in a silicon oxynitride layer may produce more charge traps in such a charge storing layer than silicon oxynitride layers having a lower percentage of silicon.

Figure 2B:

A portion of an integrated circuit following a step 104 is shown in FIG. 2B. A step 104 can result in a second portion of a charge storing layer 206 being formed over a first portion 204.

Referring again to FIG. 1, a first embodiment 100 may also include forming at least a third portion of a charge storing layer by changing to a third gas flow rate ratio that is different than a second gas flow rate ratio (step 106). It is understood that while a third gas flow rate ratio can be different than a second gas flow rate ratio, a third gas flow rate ratio can be the same as, or similar to, a first gas flow rate ratio. Preferably, a third gas flow rate ratio can be the same as a first gas flow rate ratio.

In this way, a charge storing layer may be formed having first, second and third portions. A second portion may form a layer having a higher percentage of silicon than a first portion, and preferably than a first and third portion.

It is understood that while the materials of a charge storing layer have been described as silicon oxynitride, a charge storing layer may generally be described as a silicon nitride. It is understood that a "silicon nitride" may describe materials that include elements beside silicon and nitrogen. Further, ratios between silicon and nitrogen may differ from stoichiometric ratio ($Si_3N_4$). As but a few of the possible examples, a silicon nitride may include hydrogen $SiN_XH_Y$ and/or oxygen $SiO_XN_Y$ or both $SiO_XN_YH_Z$ (i.e., a type of silicon oxynitride). One way of identifying such silicon nitride layers may be by a resulting refractive index of such a material. In one particular approach, a charge storing layer according to an embodiment may be formed from a silicon nitride material having a refractive index in the range of about 1.4 to 2.2, preferably about 1.5 to 2.1.

Referring back to FIG. 1, a preferred embodiment may include an optionally repeating any previous steps (step 108). In this way, a charge storing layer may include more than three portions, and may include multiple portions having a higher percentage of silicon than other portions.

Figure 2C:
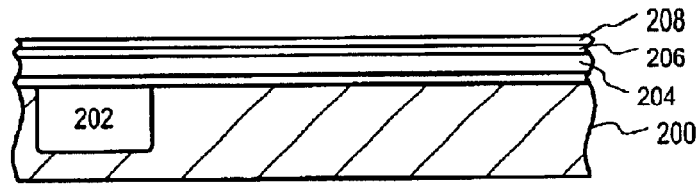

A portion of an integrated circuit following a step 108 is shown in FIG. 2C. A step 108 can result in a third portion of a charge storing layer 208 being formed over a second portion 206. First, second and third portions (204, 206 and 208) may form a multilayered charge storing dielectric.

Accordingly, unlike conventional approaches that may deposit essentially a uniform silicon nitride layer in a CVD machine, a multilayered charge storing layer can be formed by changing a gas flow rate ratio to alter the proportion of one element with respect to at least one other element. Changing flow rates during one CVD process may allow for a thinner layer of a different material than conventional approaches.

It is noted that a multilayered charge storing layer according to the present invention may be included as a charge storing dielectric within a SONOS-type device. If such a charge storing layer includes a silicon rich portion, charges may be trapped therein, instead of tunneling through. Consequently, a charge distribution (e.g., a charge centroid) may be situated closer to a substrate. This may allow for faster programming times in a SONOS-type device as less charge may be needed to establish a given threshold voltage shift. In addition or alternatively, such a charge storing dielectric may enable a resulting SONOS-type device to be scaled down with other devices. This may also improve retention characteristics.

A second embodiment of the present invention will now be described with reference to FIGS. 3 and 4A to 4C.

A second embodiment may include a method of in situ formation of a series of semiconductor device layers with different gas flow rate ratios. In particular, such layers may include a charge storing layer having an increased charge trapping portion. Even more particularly, a SONOS-type dielectric can be formed with a middle dielectric having one or more portions with increased charge trapping, where such increased charge trapping portions can be formed in situ with respect to all other layers of a SONOS-type dielectric.

Figure 3:
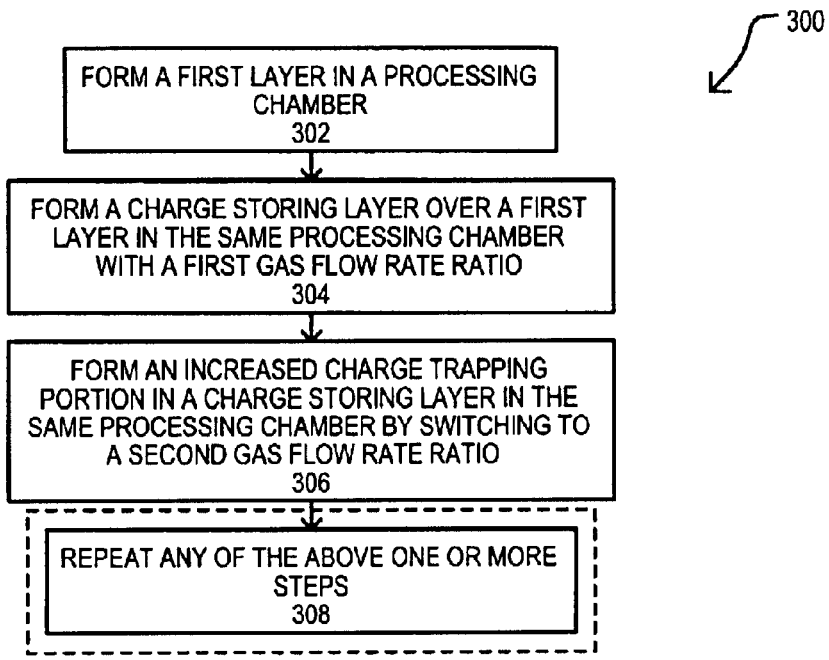
FIG. 3 is a flow diagram showing a method of manufacturing a charge storing layer with a charge trapping portion according to another embodiment.

A method according to a second embodiment is set forth in a flow diagram in FIG. 3, and designated by the general reference character 300. A method 300 may include forming a first layer in a processing chamber (step 302).

Figure 4A:
FIGS. 4A to 4C are side cross-sectional views showing the method of FIG. 3.

A portion of an integrated circuit following a step 302 is set forth in FIG. 4A. Such an integrated portion may include a substrate 400 that can include one or more isolation structures 402 formed by conventional process steps. Like FIG. 2A, it is understood that a substrate 400 may include impurity regions, such as wells and/or channel regions. A step 402 can result in a first layer 404 being formed over a substrate 200.

A first layer 404 may be a conductive layer or an insulating layer. Preferably, a first layer may be an insulating layer, even more preferably a tunnel dielectric. A tunnel dielectric may have a thickness that is small with respect to subsequently formed dielectric layers. A tunnel dielectric may preferably be a silicon oxide layer having a thickness in the general range of 10–100 Å, preferably about 10–50 Å, even more preferably about 20 Å. Of course, a silicon oxide is understood to include silicon dioxide.

A second embodiment 300 may also include forming a charge storing layer over a first layer in the same processing chamber. Such a charge storing layer may be formed with a first gas flow rate ratio (step 304).

Figure 4B:
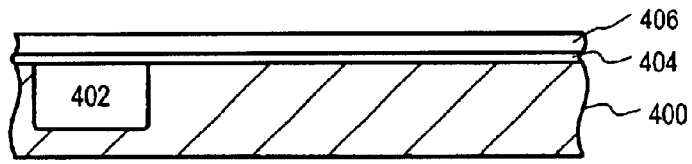

A portion of an integrated circuit following a step 304 is set forth in FIG. 4B. A charge storing layer 406 may be formed over a first layer 404. A charge storing layer may be a silicon nitride, preferably a silicon oxynitride. In one particular approach, a silicon oxynitride layer may have a thickness of less than about 200 Å, preferably less than 120 Å, even more preferably about 95 Å. A silicon nitride charge storing layer 406 may be formed with a chemical vapor deposition, preferably a low pressure CVD. Base materials of such an LPCVD process may include $NH_3$, DCS and $N_2O$.

In one very particular arrangement, a charge storing layer according to a step 304 may be formed with a gas flow rate ratio as described in conjunction with step 102 of FIG. 1.

A second embodiment 304 may further include forming an increased charge trapping portion in a charge storing layer in the same processing chamber by switching to a second gas flow rate ratio (step 306).

Figure 4C:
Figure 5:
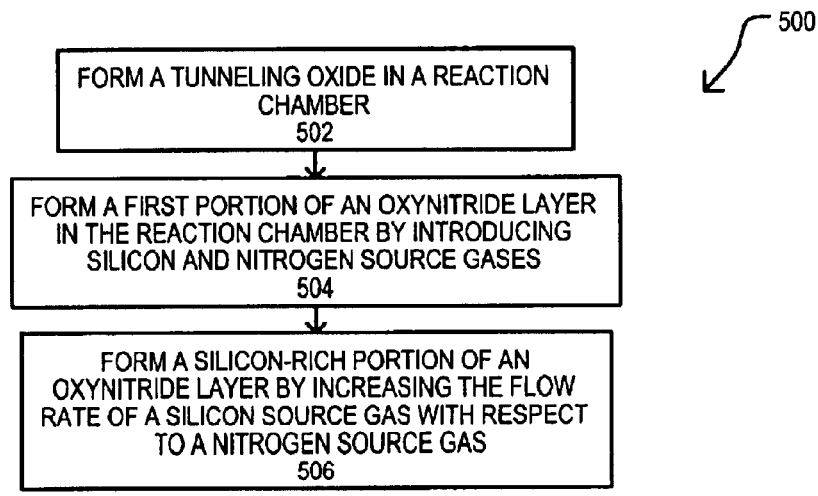
FIG. 5 is a flow diagram showing a method of manufacturing an oxynitride layer according to another embodiment.

A portion of an integrated circuit following a step 306 is set forth in FIG. 4C. An increased charge trapping portion 408 for a charge storing layer 406 may be formed. In one particular arrangement an increased charge trapping portion 408 may be formed by increasing at least one element with respect to other elements, preferably increasing a proportion of a conductive or semiconductive component with respect to non-conductive components, more preferably increasing a proportion of silicon with respect to nitrogen and/or oxygen.

In one particular arrangement, an increased charge trapping layer according to a step 306 may be formed with a gas flow rate ratio as described in conjunction with step 104 of FIG. 1.

Referring back to FIG. 3, a second embodiment 300 may also include repeating any of the various steps previously described. It is noted that steps 304 and 306 in combination may form a charge storing layer and increased charge trapping portion. Repeating a step 304 may result in a single increased charge trapping portion. However, repeating steps 304 and 306 one or more times, followed by a last repeat of step 304 may form two or more increased charge trapping portions.

A charge storing layer according to a second embodiment may have the various advantages noted for a first embodiment. In addition, or alternatively, unlike conventional SONOS manufacturing approaches, a charge storing layer having one or more increased charge trapping portions may be formed in situ. Thus, wafers manufactured with a layer according to a second embodiment can be formed in the same wafer processing tool, avoiding a wafer transfer between tools, as may occur conventionally. In this way, a high-quality ONO-type dielectric may be achieved with clean interfaces and/or without variations in the thickness of the dielectric layers and/or high particle count values that may occur in conventional approaches.

A third embodiment of the present invention will now be described with reference to FIGS. 5 and 6A to 6C.

A third embodiment may include a method for forming a dielectric for a device that operates according to the tunneling of charge (e.g., the tunneling of electrons and/or "holes") and storing of charge in an oxynitride layer having a silicon rich portion.

A third embodiment is designated by the general reference character 500, and may include the steps of forming a tunnel oxide layer (step 502).

A step 502 may include growing a tunnel dielectric layer with an oxidation that is longer in duration and lower in pressure than conventional tunnel oxidation steps for SONOS-type devices. A suitable pressure according to a step 502 may be less than about 2,000 milliTorr (mTorr), preferably less than about 1,500 mTorr, more preferably less than about 1,380 mTorr. A suitable oxidation time according to a step 502 may have a duration of greater than about 45 minutes, preferably greater than about 1 hour, and more preferably greater than about 1 hour and 40 minutes.

It is noted that a long, low pressure oxidation step as noted above may result in a more uniform oxide than conventional approaches that may form a tunneling dielectric at higher pressures and/or for shorter periods of time. Further, such a step may be in contrast to conventional manufacturing processes the purposely seek to reduce the time required to perform a particular process step.

In one arrangement, forming a tunnel dielectric layer (step 502) may include a step of introducing an oxygen source gas into a reaction chamber. Preferably an oxygen source gas may include oxygen gas ($O_2$).

Figure 6A:
FIGS. 6A to 6C are side cross-sectional views showing the method of FIG. 5.

A portion of an integrated circuit following a step 502 is set forth in FIG. 6A. Referring to FIG. 6A, an integrated circuit portion can include a substrate 600 and an isolation region 602 formed by prior conventional process steps. A step 502 may form a tunnel oxide layer 604 over a substrate 600. A tunnel oxide layer 604 can be generally very thin with respect to other device layers, and may have a thickness of less than about 50 Å thick, preferably less than 30 Å, more preferably about 20 Å.

A third embodiment 500 may continue by forming at least a first portion of an oxynitride layer by introducing silicon and nitrogen source gases into the same reaction chamber (step 504). A step 506 may include an LPCVD of silicon oxynitride. A silicon source gas may include DCS. A nitrogen source gas may include $NH_3$. In one arrangement, an oxygen source gas may also be introduced to the reaction chamber. The oxygen source gas may include $N_2O$.

Figure 6B:

Referring now to FIG. 6B, an example of a portion of an integrated circuit following a step 504 is set forth. Referring to FIG. 6B, a portion of an integrated circuit includes an oxynitride layer 606 on a tunnel oxide 604. An oxynitride layer may have a thickness of about 80–100 Å, as but one example.

A third embodiment 500 may further include forming a silicon-rich portion of an oxynitride layer by increasing the flow rate of a silicon source gas with respect to a nitrogen source gas (step 506). In one approach, a flow rate ratio between $NH_3$ and DCS may be switched from about 3 to 1, to about 1 to 2–4, more particularly about 1 to 3. At the same time, $N_2O$ flows may be reduced, preferably to essentially zero. In one very particular approach, increasing a flow rate of silicon source gas with respect to a nitrogen source gas may result in $NH_3$ flow rates of about 30 sccm, and DCS flow rates of about 90 sccm. Such flow rates may be maintained for about 1.5 minutes, for a resulting silicon-rich silicon oxynitride layer thickness of about 15 Å.

Figure 6C:

FIG. 6C show an example of a portion of an integrated circuit following a step 506. A silicon rich portion 608 of a silicon oxynitride layer may be formed.

A third embodiment 500 can therefore result in an integrated circuit dielectric structure that includes a tunnel oxide and an oxynitride layer having a silicon rich portion therein.

A fourth embodiment of the present invention will now be described with reference to FIGS. 7 and 8A–8H.

The fourth embodiment can include a method for in-situ formation of a dielectric for a SONOS-type device that may include a tunnel dielectric layer, a charge storing layer over a tunnel dielectric, and a top dielectric over a charge storing layer. A charge storing dielectric may be multi-layered, including at least a first portion, a second portion over the first portion, and third portion over the second portion. At least a first and second portion may be formed by different source gas flow rate ratios.

Figure 7:
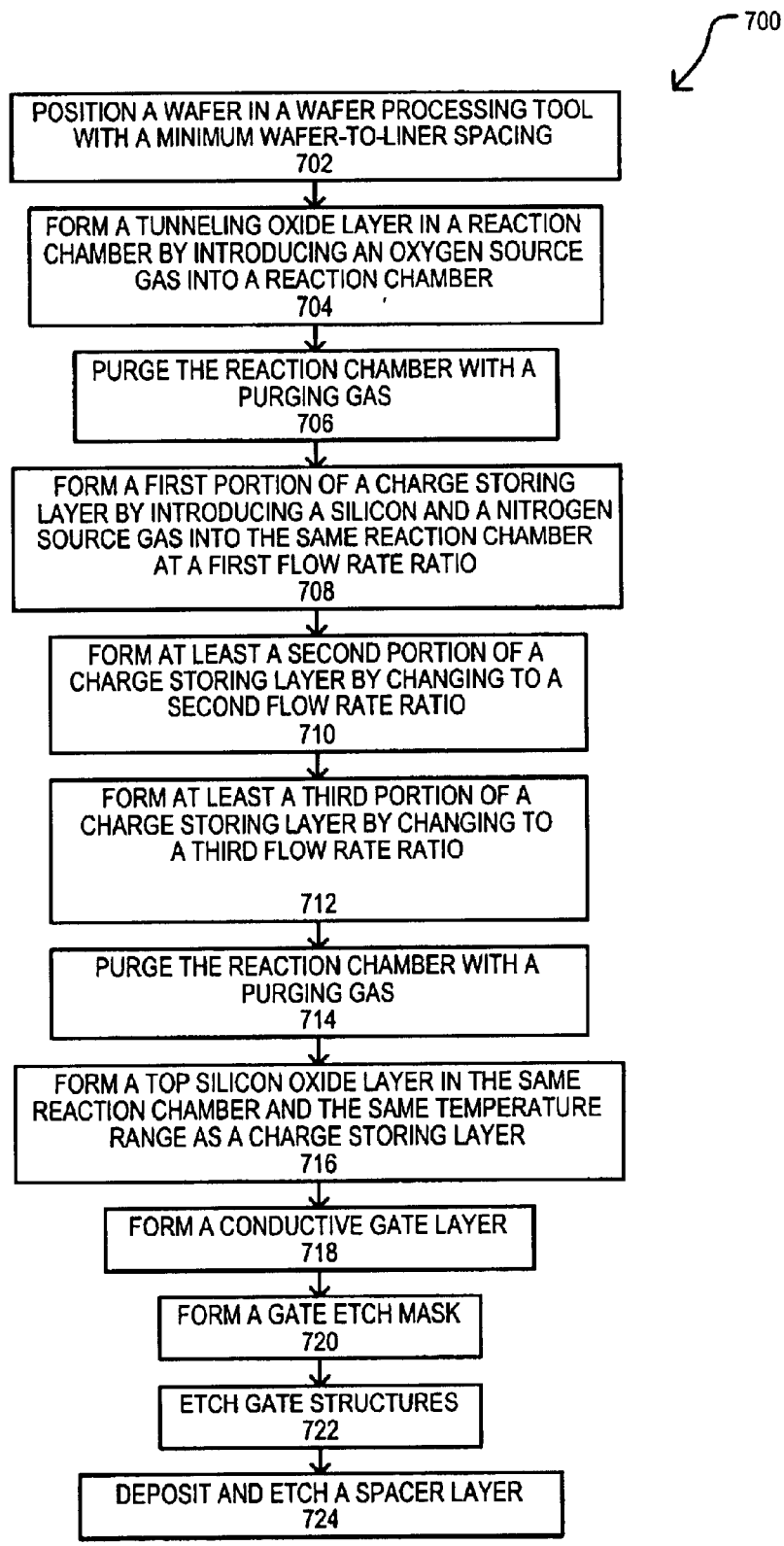
FIG. 7 is a flow diagram showing a method of manufacturing a nonvolatile transistor according to another embodiment.

A method according to the fourth embodiment is shown in FIG. 7, and designated by the general reference character 700. A method 700 may include the steps of positioning a wafer in a wafer processing tool with a minimum wafer-to-liner spacing (step 702).

Figure 8A:
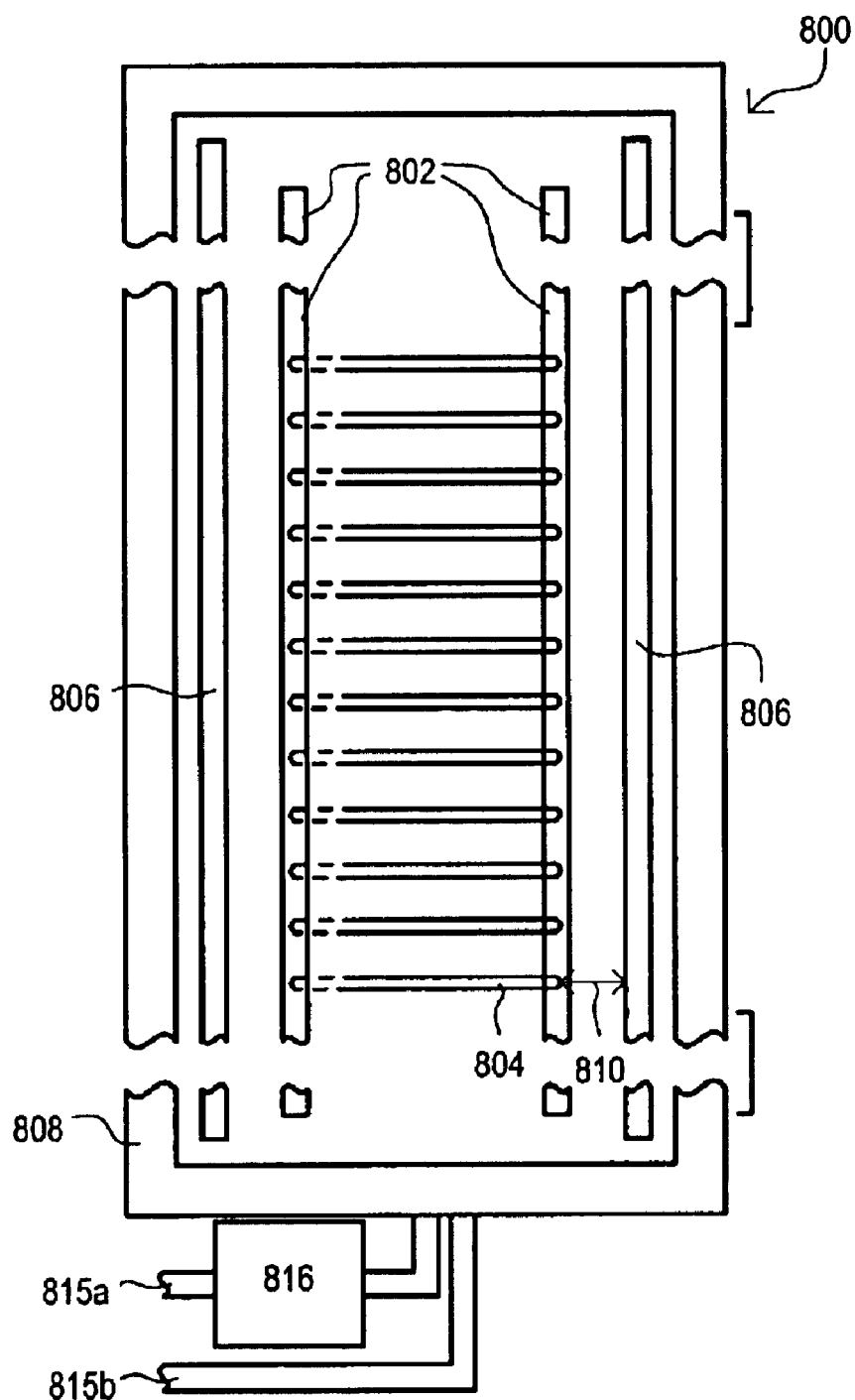
FIG. 8A is a side cross-sectional view of a wafer processing tool that may be used in the present invention.

Referring to FIG. 8A, a side cross-sectional view of a wafer processing tool that may be used in the present invention is set forth. As shown in FIG. 8A, a wafer processing tool 800 may include a quartz wafer holder or a wafer "boat" 802. A wafer boat 802 may be capable of holding a number of wafers (one of which is shown as item 804). As shown in FIG. 8A, a wafer processing tool 800 may also include a liner 806 and a furnace "tube" 808. A liner 806 may circumscribes an inner circumference of a tube 808. A distance between an outer edge of a wafer 804 and a liner 806 can be considered a wafer-to-liner spacing 810.

If reference is made to FIG. 8A, in accordance with a step 702, a wafer-to-liner spacing 810 may have a minimum value. In one very particular example, a wafer-to-liner spacing 810 may be no more than 6.5 cm, preferably no more than 3.5 cm, even more preferably no more than 2.5 cm.

Preferably, a wafer processing tool may include a heater 816 for preheating a source gas 815a. One or more other source gases 815b may be introduced into a reaction chamber without being preheated.

A fourth embodiment 700 may continue by forming a tunnel dielectric layer by introducing an oxygen source into a reaction chamber (step 704). In one particular arrangement, a step 704 may include growing oxide in a furnace at a pressure in the general range of about 400 mTorr to about 1500 mTorr, preferably about 500 mTorr to about 1375 mTorr. An oxidizing temperature may be in the general range of about 600 to about 1000° C., preferably about 700 to about 850° C., more preferably about 750 to about 810° C. Oxygen gas ($O_2$) may flow at a rate in the range of about 100 standard cubic centimeters per minute (sccm) to—about 300 sccm, more preferably about 200 sccrn. Such an oxidation may take between about 1 to about 3 hours, preferably about 1 to about 2 hours, even more preferably about 1 hour and 40 minutes. A tunneling oxide may have a thickness in the general range of about 10 Å to about 100 Å, preferably about 10 Å to about 50 Å, even more preferably about 20 Å.

Figure 8B:
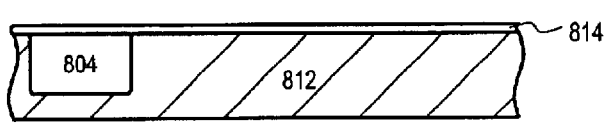
FIGS. 8B to 8H are side cross-sectional views showing the method of FIG. 7.

An example of a semiconductor device following a step 704 is shown in FIG. 8B. A tunneling oxide 814 has been formed on a substrate 812. A substrate 812 may include isolation structures 804. Isolation structures 804 may be formed from silicon dioxide by shallow trench isolation (STI) and/or local oxidation of silicon (LOCOS) techniques, as but two examples. A tunneling oxide 814 may have a thickness in the general range of 10–100 Å, preferably about 10–50 Å, even more preferably about 20 Å.

In this way, a tunneling dielectric for a SONOS-type nonvolatile storage device may be formed.

A fourth embodiment 700 can continue by purging the wafer process furnace with a purging gas (step 706). A purging gas may comprise a nitrogen gas ($N_2$). A purging step may last for about 30 minutes.

A method 700 may further include forming a first portion of a charge storage layer at a first flow rate ratio by introducing a silicon source gas and a nitrogen source gas into the same reaction chamber (step 708).

A step 708 may include a low pressure chemical vapor deposition (LPCVD) Of silicon oxynitride. Silicon oxynitride may be formed with precursor gases that include nitrogen source gas $NH_3$, oxygen source gas $N_2O$ and silicon source gas DCS.

In one particular approach, $NH_3$ flow rates may be 2–4 times greater than DCS flow rates, more preferably about 3 times greater. $N_2O$ flow rates may be 1–3 times greater than DCS flow rates, more preferably about 2 times greater. In one very particular approach, $NH_3$ flow rates may be about 150 sccm, $N_2O$ flow rates may be about 110–117 sccm, and DCS flow rates may be about 50 sccm. A chamber temperature may be in the general range of 700–800° C., more particularly about 760° C. A deposition time may be about 6.5 minutes.

In a preferred method, $NH_3$ may preferably be introduced into a chamber for 1–2 minutes before other reaction gases. If reference is made back to FIG. 8A, a source gas 815a can be preheated in a heater 816 before being introduced into a processing chamber (e.g., a furnace tube 808).

Figure 8C:
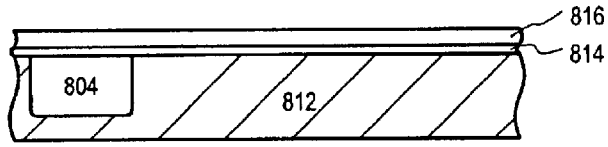

An example of a semiconductor device following a step 708 is shown in FIG. 8C. A first portion of a charge storing layer 816 can be formed over a tunnel dielectric layer 814. A first portion of a charge storing layer 816 may have a given proportion of silicon according to a first gas flow rate ratio, noted above. A first portion of a charge storing layer 816 may have a thickness in the general range of 30–60 Å, preferably about 40 Å.

Once a first portion of a charge storing layer has been formed, at least a second portion of a charge storing layer may be formed by changing to a second flow rate ratio (step 710). A step 710 may include changing flow rates of one or more source gases included in a step 704. Preferably, a flow rate ratio between $NH_3$ and DCS may be changed. As but one example, a flow rate ratio between $NH_3$ and DCS may be switched from about 3 to 1, to about 1 to 2×, more particularly about 1 to 3. At the same time, $N_2O$ flows may be reduced, preferably to zero. In one very particular approach, $NH_3$ flow rates may be about 30 scm, $N_2O$ flow rates can be 0 sccm, and DCS flow rates may be about 90 sccm. A change in flow rates may be maintained for about 1.5 minutes, for a resulting silicon-rich silicon nitride layer thickness of about 15 Å.

Figure 8D:
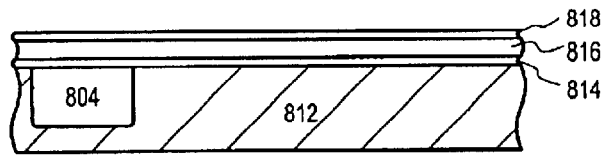

An example of a semiconductor device following a step 710 is shown in FIG. 8D. A second portion of a charge storing layer 818 has been formed over a first portion of a charge storing layer 816. A change in flow rates may result in a second portion 818 having a different percentage of constituent elements than a first portion 816. In particular, a second portion of a charge storing layer 818 may have a higher percentage of silicon than a first portion 816. Such a "silicon-rich" silicon oxynitride layer 816 may have a thickness in the general range of 10–20 Å, preferably about 15 Å. A second portion 818 may serve to alter charge trapping properties of a charge storing layer as compared to conventional charge trapping layers formed from one uniform material. In particular, a silicon-rich oxynitride second portion 818 may have a greater number of charge traps, and thus may trap a greater amount of tunneled charge closer to a substrate 812 than conventional approaches.

After forming a second portion 818 of a charge storing layer, a method 700 may form a third portion of a charge storing layer by altering, once again, source gas flow rate ratios (step 712). Preferably, such a step may include changing a third gas flow rate ratio back to the first gas flow rate described for a step 708. At preferred variables indicated for step 708, a deposition time for a step 712 may be about 6.5 minutes.

Figure 8E:
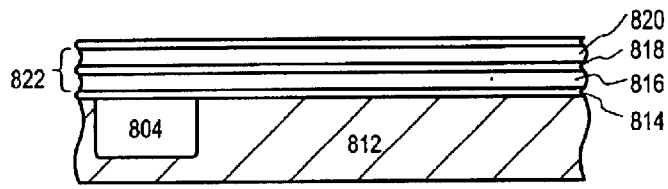
Figure 8F:
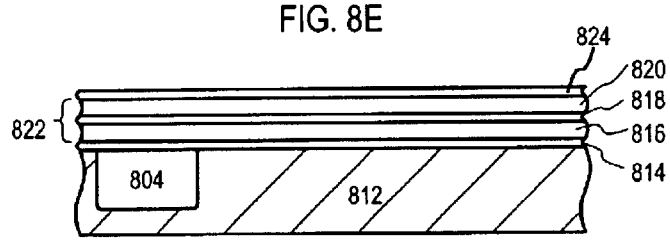

An example of a semiconductor device following a step 712 is shown in FIG. 8E. A third portion of a charge storing layer 820 may be formed over a second portion of a charge storing layer 818. In a preferred embodiment, a third portion of a charge storing layer 820 may have a lower percentage of silicon than a second portion of a charge storing layer 818. A third portion of a charge storing layer 818 may have a thickness in the general range of 30–60 Å, preferably around 40 Å.

It is understood that while the embodiment shown in FIGS. 7 and 8B–8E, show a nonvolatile device with a single silicon rich layer (second portion 816), steps 710 and 712 may be repeated to form multiple silicon-rich silicon nitride layers, if desired. Such an arrangement may provide greater charge trapping capabilities than a single layer of silicon-rich silicon nitride. Still further, while the above embodiment has positioned a silicon-rich second portion 816 in a central position within a charge storing layer, such a silicon-rich layer may be formed by changing depositions variables sooner (for a silicon-rich layer closer to a substrate), or later (for a silicon-rich layer further from a substrate).

In this way, a charge storing dielectric for SONOS-type nonvolatile storage devices may be formed that includes one or more silicon-rich silicon nitride layer.

A fourth embodiment 700 can continue by purging the reaction chamber with a purging gas (step 714). A purging gas may comprise $N_2$. A purging step may last for about 30 minutes.

A method 700 may continue by depositing a top layer of silicon dioxide in the same reaction chamber and the same temperature range as a charge storing layer (step 716). In one approach, a step 716 may include chemical vapor deposition of silicon dioxide with precursor materials of $N_2O$ and DCS. $N_2O$ flow rates may be 2.5 to 3.0 times greater than a DCS rate, more preferably about 2.86 times greater. In one very particular approach, $N_2O$ flow rates may be about 40 sccm and DCS flow rates may be about 14 sccm. A chamber temperature may be in the general range of 700–800° C., more particularly about 760° C. A deposition time may be about 15 minutes.

An example of a semiconductor device following a step 716 is shown in FIG. 5F. A top insulating layer of silicon oxide 824 can be formed over a charge storing layer 822. A silicon dioxide layer 824 may have a thickness in the general range of 20–60 Å, preferably about 40 Å.

It is noted that an embodiment may be conceptualized as including ONO-type dielectric having a charge trapping layer formed in a central charge storing layer. More particularly, a tunnel dielectric 814 and top insulating layer 824 may form lower and top layers of a ONO-type dielectric, a charge storing layer 822 may include portions (816, 818 and 820), where second portion 818 may be a charge trapping layer.

A method according to a fourth embodiment 700 can also include forming a conductive gate layer (step 718). A step 718 may include depositing a layer of polycrystalline and/or amorphous silicon (herein polysilicon). A polysilicon layer may be deposited with conventional techniques to a thickness in the general range of about 1,000 to 3,000 Å, preferably about 1,500 to 2,500 Å, more preferably about 2,000 Å.

It is noted that a step 718 may further include forming a gate protection insulator over a conductive gate layer. Such a gate protection insulator may comprise a silicon nitride and/or a silicon dioxide, preferably a silicon dioxide.

As shown in FIG. 7, a fourth embodiment 700 may further include forming a gate etch mask (step 720). Such a step may include forming gate etch masks over locations where nonvolatile memory transistors may be formed. Such a step may include conventional photolithography steps, or the like.

Figure 8G:
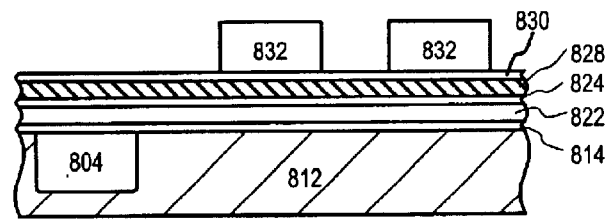

An example of a portion of an integrated circuit following steps 718 and 720 is set forth in FIG. 8G. Referring to FIG. 8G, a conductive gate layer 828 can be deposited on a top insulating layer 824. As also shown in FIG. 8G, a gate protection insulator 830 may be formed over a conductive gate layer 828. Still further, gate etch masks 832 may be formed on a gate protection insulator 830 that may include silicon nitride, preferably silicon oxynitride, even more preferably silicon oxide.

A method 700 may also include etching gate structures (step 722). A step 722 may include anisotropically etching with gate masks in place to form gate structures. Such etching may preferably include reactive ion etching.

It is also noted that following the formation of gate structures, one or more conventional ion implantation steps may take place to form particular impurity regions, such as lightly doped diffusions (i.e., lightly doped drains—LDD), or the like.

Following an etching of gate structures, a spacer layer may be deposited and etched to form spacers (step 724). A step 724 may include depositing a layer of silicon dioxide with tetraethylorthosilicate (TEOS) as a source material. A spacer layer 836 may have a thickness of about 800–2,000 Å, more preferably about 900–1,500 Å, even more preferably about 1,100 Å. Such a spacer layer may then be etched back with an anisotropic etch, such as reactive ion etching (RIE), to form insulating spacers.

Figure 8H:
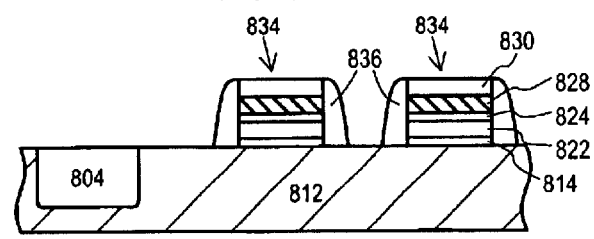
Figure 9A:
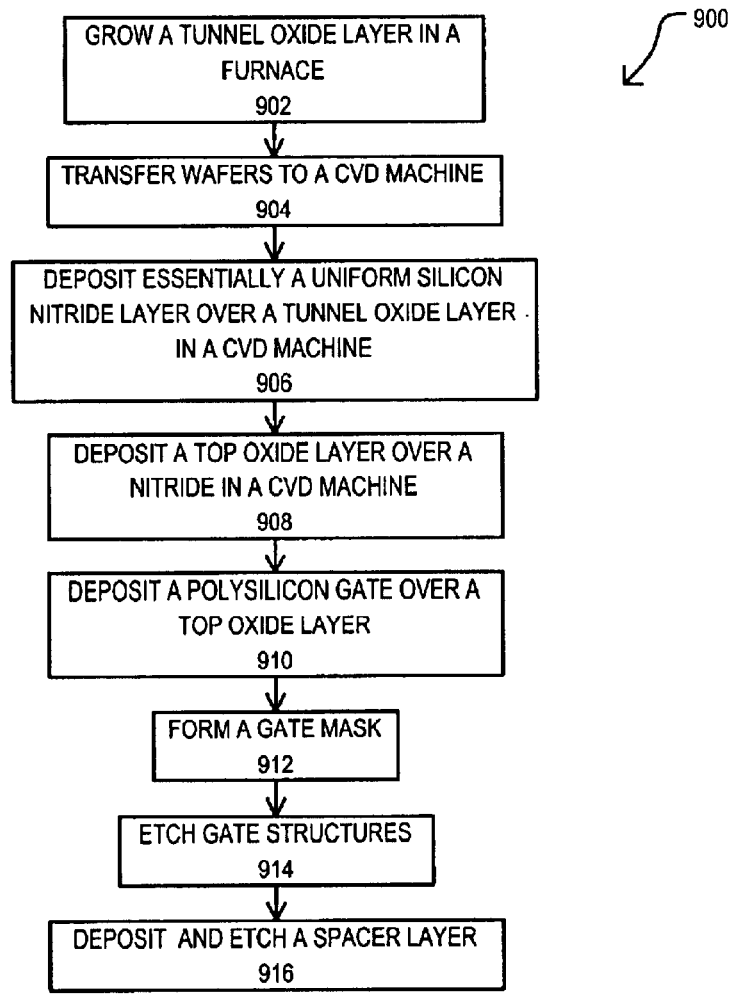
FIG. 9A is a flow diagram showing a conventional method of manufacturing a SONOS-type device.
Figure 9B:
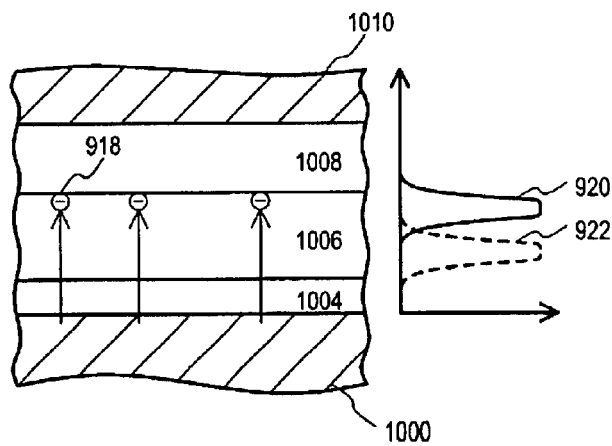
FIG. 9B is a side cross sectional view and graph showing a charge distribution of a conventional SONOS-type device.
Figure 10A:
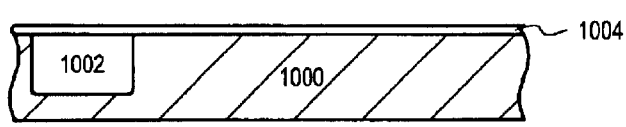
FIGS. 10A to 10F are side cross-sectional views showing the conventional method of FIG. 9A.
Figure 10B:
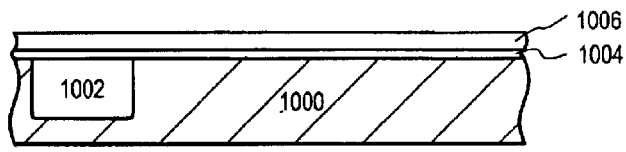
Figure 10C:
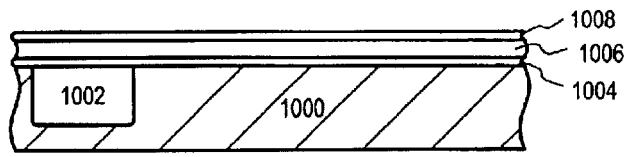
Figure 10D:
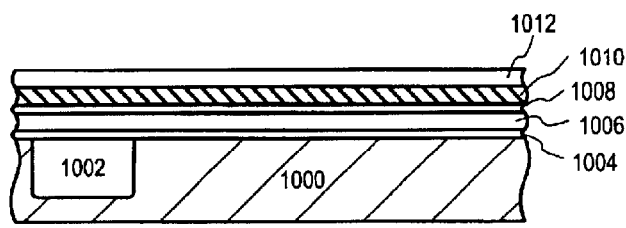
Figure 10E:
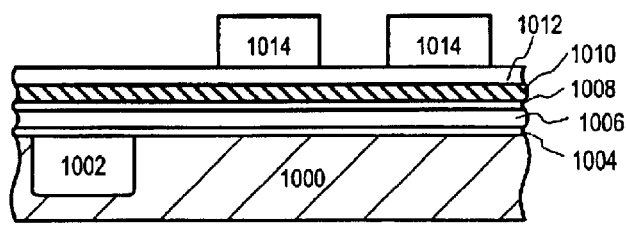
Figure 10F:
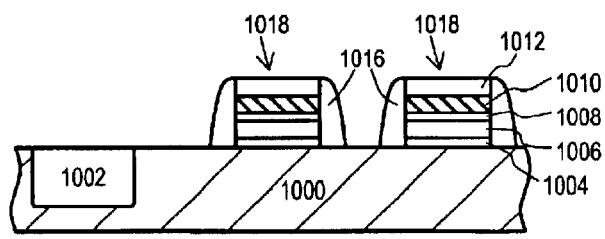

An example of a portion of an integrated circuit following steps 722 and 724 is set forth in FIG. 5H. Referring to FIG. 8H, gate structures 834 may be formed over a semiconductor substrate 812. Each gate structure 834 may form a nonvolatile transistor and include a tunneling oxide 814, a charge storing layer 822, a top insulating layer 824, a conductive control gate 828, and a gate protection insulator 830. As also shown in FIG. 8H, insulating spacers 836 may be formed on the sides of gate structures 834

A fourth embodiment 700 may therefore result in an integrated circuit containing an oxynitride layer of a charge storing layer that may have a silicon-rich portion. A silicon-rich oxynitride may store and trap more charge than a silicon oxynitride layer having less silicon. A nonvolatile gate dielectric may be formed that may trap charge, and thereby preventing such charge from accumulating at a higher dielectric layer interface. In this way, a SONOS-type device may be formed having greater charge trapping capacities than other conventional approaches.

The use of a same reaction chamber and temperature range as noted for step 716 may reduce defects and introduction of undesirable impurities by reducing a wafer's exposure to temperature variations and external environments as compared to conventional approaches that may transfer a wafer. In addition, such an approach may simplify a manufacturing process by localizing the formation of a SONOS-type device dielectric. Further, and decrease a processing cycle time may be improved by reducing transfers between machines.

It is further noted that a particular wafer-to-liner spacing, like that indicated in step 702, may result in one or more SONOS-type dielectric layers having greater uniformity than other conventional approaches. As a result, a nonvolatile transistor manufactured according to a fourth embodiment may have greater uniformity in properties across a wafer.

While the present invention has described a charge storing layer for a SONOS-type device, it is understood the that term "charge storage" could include other types of materials, including but not limited to other types of devices, such as ferroelectric devices, or the like.

Thus, it is understood that while various embodiments have been described in detail, the present invention could be subject to various changes, substitutions, and alterations without departing from the spirit and scope of the invention. Accordingly, the present invention is intended to be limited only as defined by the appended claims.

What is claimed is:

1. A method for forming a charge storing layer of a semiconductor device, comprising the steps of:

forming a first portion of a charge storing layer with a plurality of source gases introduced to a reaction chamber at a first gas flow rate ratio between at least two of the source gases; and forming at least a second portion of the charge storing layer by changing to a second gas flow rate ratio between the at least two source gases.

2. The method of claim 1, wherein:

the first gas flow rate ratio is no less than 2:1 with respect to a first source gas and a second source gas.

3. The method of claim 2, wherein:

the second gas flow rate ratio is less than 1:2 with respect to the first source gas and the second source gas.

4. The method of claim 1, wherein:

the first gas flow rate ratio is no less than 2.7:1 with respect to a first source gas and a second source gas.

5. The method of claim 1, further including:

forming at least a third portion of the charge storing layer by changing to a third gas flow rate ratio from the second gas flow rate ratio.

6. The method of claim 5, wherein:

the third gas flow rate ratio is essentially the same as the first gas flow rate ratio.

7. The method of claim 1, wherein:

the source gases include at least one silicon source gas and at least one nitrogen source gas.

8. A method of forming a charge storing dielectric, comprising the steps of:

forming at least one charge trapping portion of a charge storing layer by switching from a first flow rate ratio of source gases to a second flow rate ratio of the source gases.

9. The method of claim 8, wherein:

the first and second flow rate ratios are between a silicon source gas (SSG) and at least another source gas (X), and the first SSG:X ratio is less than the second SSG:X ratio.

10. The method of claim 9, wherein:

the silicon source gas comprises a silane gas.

11. The method of claim 9, wherein:

the at least another source gas comprises ammonia gas.

12. The method of claim 8, further including:

forming the at least one charge trapping portion of the charge storing layer includes forming a silicon-rich charge trapping portion of a silicon oxynitride charge storing layer by switching to the second flow rate ratio.

13. The method of claim 8, wherein:

the charge trapping portion has a thickness of no more than 20 angstroms.

14. The method of claim 8, further including:

switching from the second flow rate ratio to a third flow rate ratio of the source gases.

15. A method of forming a nonvolatile transistor, comprising the steps of:

forming a multilayered dielectric between a tunnel dielectric and a top insulating layer by temporarily changing the rate at which a first constituent element is introduced into a reaction chamber with respect to a second constituent element.

16. The method of claim 15, wherein:

the multilayered dielectric comprises a silicon nitride and the first constituent element comprises silicon and the second constituent element comprises nitrogen.

17. The method of claim 16, wherein:

changing the rate includes increasing the rate at which the first constituent element is introduced into the chamber with respect to the second constituent element.

18. The method of claim 15, further including:

forming the tunnel dielectric by oxidizing a silicon substrate.

19. The method of claim 15, further including:

forming the top insulating layer by depositing a layer comprising silicon dioxide.

20. The method of claim 15, further including:

forming a conductive gate layer over the top insulating layer.

* * * * *